United States Patent
Chew et al.

(10) Patent No.: US 7,330,105 B2
(45) Date of Patent: Feb. 12, 2008

(54) SYSTEM AND APPARATUS FOR VEHICLE ELECTRICAL POWER ANALYSIS

(75) Inventors: Song Kit Chew, Singapore (SG); Bon Kwe Lee, Singapore (SG)

(73) Assignee: Vepac Technology Pte Ltd., Singapore (SG)

( * ) Notice: Subject to any disclaimer, the term of this patent is extended or adjusted under 35 U.S.C. 154(b) by 183 days.

(21) Appl. No.: 10/562,373

(22) PCT Filed: Jun. 1, 2004

(86) PCT No.: PCT/SG2004/000164

§ 371 (c)(1),
(2), (4) Date: Dec. 23, 2005

(87) PCT Pub. No.: WO2004/113943

PCT Pub. Date: Dec. 29, 2004

(65) Prior Publication Data

US 2007/0103284 A1    May 10, 2007

(30) Foreign Application Priority Data

Jun. 23, 2003 (SG) ............................. 200303590

(51) Int. Cl.
*B60Q 1/00* (2006.01)
*G08B 21/00* (2006.01)
*G01R 31/36* (2006.01)
*H02J 7/00* (2006.01)

(52) U.S. Cl. .............. 340/455; 340/636.1; 340/636.12; 340/636.15; 702/63; 702/66; 123/406.53

(58) Field of Classification Search ................ 340/455
See application file for complete search history.

(56) References Cited

U.S. PATENT DOCUMENTS 4,731,601 A    3/1988    Nowakowski et al.

(Continued)

FOREIGN PATENT DOCUMENTS

TW    451068 B    8/2001

OTHER PUBLICATIONS

International Search Report from International Application No. PCT/SG2004/000164 mailed Jul. 21, 2004 (5 pages).
Written Opinion from International Application No. PCT/SG2004/000164 mailed Jul. 21, 2004 (2 pages).

(Continued)

*Primary Examiner*—Donnie L. Crosland
(74) *Attorney, Agent, or Firm*—Christie, Parker & Hale, LLP.

(57) ABSTRACT

Apparatus for monitoring an electrical power supply system of a vehicle, the vehicle having a battery and internal combustion engine, an alternator, and a starter. The apparatus has a filter for determining the battery terminal voltage when the vehicle ignition is turned on. There is also a voltage gradient detector for detecting phase and gradient change of the battery terminal voltage when the vehicle ignition is on. A waveform detector is used for detecting and separating different waveforms when the vehicle ignition is on, and an engine-rotating sensor is used to sense a speed of the internal combustion engine when the vehicle ignition is on. Also included is a processor for processing at least one of the battery terminal voltage, the phase and gradient change, the different waveforms, and the speed of the internal combustion engine. An output is provided that is indicative of a condition of the electrical power supply system. A system for monitoring an electrical power supply system of a vehicle is also disclosed.

26 Claims, 11 Drawing Sheets

U.S. PATENT DOCUMENTS 5,798,934 A      8/1998   Saigo et al.
6,061,638 A *    5/2000   Joyce .......................... 702/63
6,828,914 B2 * 12/2004   Zur et al. ................ 340/636.1

OTHER PUBLICATIONS

International Report on Patentability from International Application No. PCT/SG2004/000164 mailed May 23, 2005 (3 pages).

* cited by examiner

SYSTEM AND APPARATUS FOR VEHICLE ELECTRICAL POWER ANALYSIS

CROSS-REFERENCE TO RELATED APPLICATION(S)

This application is a national stage application under 35 USC § 371 of PCT Application No. PCT/SG2004/000164 filed on Jun. 1, 2004. PCT Application No. PCT/SG2004/000164 claims priority to Singapore Patent Application No. 200301590-4 filed Jun. 23, 2003.

FIELD OF THE INVENTION

The present invention relates to a vehicle electrical power system and apparatus and refers particularly throughout exclusively to a system and apparatus for monitoring, analyzing, testing and reporting on the condition of a vehicle electrical power system.

BACKGROUND TO THE INVENTION

Modern automobiles have a high level of electronic equipment. As a result the reliability of electrical power supply of a vehicle is important. The inability to detect problems, and provide an early warning of problems, extracts from the reliability of the vehicle electrical power system.

Many types of secondary storage batteries are used in the vehicle industry such as, for example, lead acid battery, nickel-cadmium battery, silver cadmium battery, and others. The most popularly used in the vehicle industry is the lead-acid battery.

Chemical storage batteries, such as lead acid batteries used in automobiles, have existed for nearly a century with much improvement in reliability. However, due to the critical working environment of the battery such as, for example wide range of operating temperatures and high cranking currents, battery power failure is still unpredictable and may at times be without warning.

A vehicle electrical power system consists of a battery, an alternator, and loads. The loads include the starter motor. The battery is the key component of the vehicle electrical power system. The battery is mainly for starting, lighting and ignition. The battery receives energy from the alternator, and supplies energy to the starter motor and other loads. Any defective element in the power system will cause system failure.

Presently, various techniques are used to determine battery status. For example, one may use the measurement of the specific gravity of the electrolyte, the measurement of open circuit voltage; the measurement of internal resistance, conductance, capacity, and cranking current, by using AC or DC source or load. A more popular method uses a load tester (Hundreds-Ampere-Second discharge) to test the battery with a high current discharge for a few seconds. It monitors voltage changes to determine battery status.

However, these tests are not the actual load on the battery under operating conditions. They are only indicative of battery status. They only indicate the condition of the battery with an open circuit and without load or charging current. This means that such testing is under "off line" conditions that provide only static data. Hence, these methods do not provide an accurate, dynamic measurement when there is interference by charging current, load current, ripple noise, and other noises, which exist in an actual operating environment.

Cranking Ampere ("CA") or Cool Cranking Ampere ("CCA") and State of Charge ("SOC") are important parameters of a battery. The cranking current capacity or cranking current percentage of a battery can only be determined by comparing the measured data with the manufacturer's reference data. A positive determination given by a CA or CCA test may not be correct if the battery is undersized for a particular application. The SOC indicates the charge percentage status of a battery. However, if the capacity of the battery is degraded, the SOC cannot used to determine the actual capacity of the battery.

SUMMARY OF THE INVENTION

In one aspect of the invention there is provided a microprocessor directly coupled with an input controller and an output controller. The input controller consists of an analogue-to-digital converter, and a voltage gradient detector. The terminal voltage of a battery being monitored is adapted to a pre-scale network filter and coupled to the analogue-to-digital converter.

The terminal voltage of the battery is compared with a reference voltage. The voltage signal is converted to digital form, and then input to microprocessor through a data bus. The voltage gradient detector detects the input waveform and provides the gradient status of the voltage signal, and input to the microprocessor. The input data analyzer and sequencer of the microprocessor process the data and provide the sequence-gating signal to control the analogue-to-digital converter, and perform data measurement.

The microprocessor executes its program in a memory consisting of ROM (read only memory), and EEROM (electrical erasable read only memory). The microprocessor also stores measurement data in the EEROM thereby using it as a database.

The data analyzer performs information processing and outputs to the output controller. It provides message, test data, and warning signals if the data is outside the set limit.

The output controller consists of a digital-to-analogue converter, message generator, message display, tone generator, tone and speaker, colour pattern generator, full colour LED, infrared printing interface, infrared transmitter, computer communication interface, and communication port. A keypad is coupled with the microprocessor for controlling inputs. A timer provides time reference to microprocessor.

The present invention is particularly applicable to the monitoring of a terminal transient response voltage waveform and using that waveform to analyze the electrical power system of the vehicle under various working conditions. At the same time it can determine the cranking circuit quality, cranking torque capability, battery and starter cranking power capability, and alternator working status, to provide comprehensive information of the engine operational status.

It may be installed in a vehicle for on line measurement, a working station, or hand-held portable system, for industrial or professional application.

BRIEF DESCRIPTION OF THE DRAWING

In order that the present invention may be readily understood and put into practical effect, there shall now be described by way of non-limitative example only a preferred embodiment of the present invention, the description being with reference to the accompanying illustrative drawings in which.

PREFERRED EMBODIMENT

Figure 1:
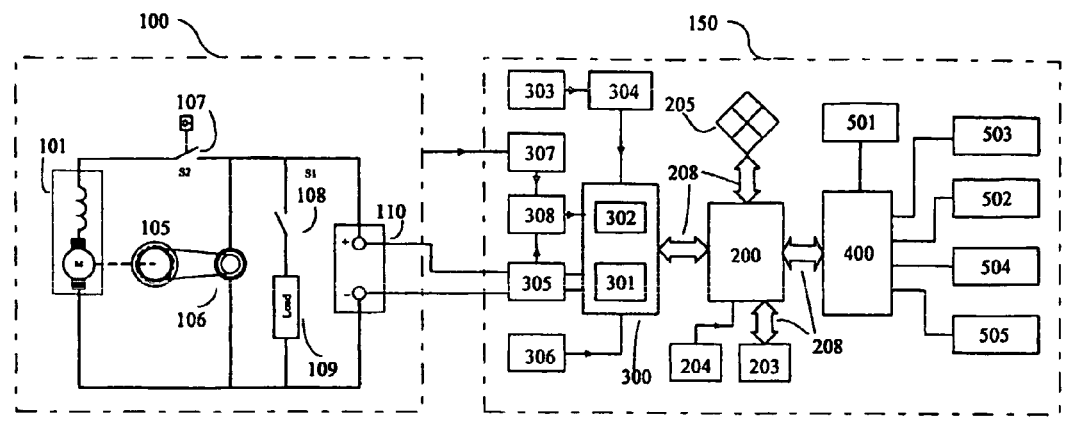
FIG. 1 is a block diagram of an embodiment for a vehicle electrical power system under test.

The embodiment illustrated in FIG. 1 shows an apparatus (150) for monitoring, testing, analyzing and the reporting of a vehicle's electrical power system. It is particularly applicable for measuring the terminal transient response voltage waveform and using that waveform to analyze the electrical power system of the vehicle at a number of different engine status conditions, including resting, cranking, and running. The apparatus (150) is able to evaluate the cranking circuit quality, cranking torque capability, battery-starter cranking power capability, and alternator charging condition. It can also provide a comprehensive report.

Referring first to FIG. 1, the vehicle electrical power system (100) consists of starter (101), internal combustion engine (105), generator or alternator (106), cranking switch (107), ignition switch (108), loads (109), and battery (110).

The internal combustion engine (105) is the main energy provider. It converts chemical energy to mechanical energy and heat. The chemical source may be gasoline, diesel, or other fuels. The internal combustion engine (105) cannot be started without an initial cranking power. The battery (110) provides power for the control system, and ignition energy for the engine once the ignition is turned on. It combines with the starter (101) to provide the initial cranking power to crank the internal combustion engine (105).

The engine (105) drives the generator or alternator (106), which converts the mechanical energy to electrical energy. The generator/alternator (106) may be a 3-phase star-connected full-wave rectifier, with a multi-pole built-in voltage regulator, and temperature compensated electro-mechanical device. The working speed of the alternator (106) is from 1,000 rpm to 10,000 rpm. Normally the rated-power output speed is around 5000 rpm. The function of the regulator is to control the output to obtain relatively constant voltage under a wide range of operating speeds and under various loads. The alternator (106) provides sufficient energy required by loads (109), and additional energy to charge the battery (110), under normal operation.

Alternator and Battery Performance

The frequency of the ripple generated by the alternator (106) can be determined as:

$$F_r = 6*P*M*S_e/60 \text{ or } F_r = 6*P*M*n$$

where P=number of pair of poles

M=mechanical coupling ratio of engine to alternator (106)

$S_e$=rotation speed of the engine (105) in rpm n=rotation speed of the engine (105) in rps For example, for a 6-pole alternator (106), having 3 pairs of poles, an engine (105) running speed range from 800 rpm to 6000 rpm, and M=1.5, the ripple frequency range is determined as:

$$F_r = 240 \text{ Hz to } 2700 \text{ Hz}$$

When any diode of a 3-phase bridge rectifier malfunctions, or any phase circuit is opened, the alternator will work as a single-phase output device. The ripple frequency then becomes:

$$F_r = 2*P*M*S_e/60$$

The Fr range becomes $$F_r = 80 \text{ Hz to } 900 \text{ Hz}$$

The speed ratio $N_a$ of the alternator and the engine is derived as follows:

$$S_a = M*S_e, \text{ then}$$

$$N_a = S_a/S_e = M$$

Normally, the speed ratio $N_a$ of alternator (106) and engine (105), $S_a/S_e$, and, the ratio of ripple frequency and ignition pulse frequency $F_r/F_i$, are constant. For a faulty alternator with one phase malfunctioning, the ripple frequency will only achieve ⅓ that of a normal alternator. A loose driving belt may change the speed ratio, or frequency ratio, due to drive belt slip. The change of speed ratio and frequency ratio can determine the condition of the alternator.

The ripple factor $R_f$ of the ripple voltage is derived as follows:

$$R_f = (V_{rr}/V_{ave})*100\%$$

where $V_{rr}$=RMS amplitude of the ripple voltage $V_{ave}$=average DC voltages output During charging by the alternator (106), the battery (110) converts the electrical energy to chemical energy in the battery cell plates. The main function of the battery (110) is to store electrical energy in chemical form when engine (105) is running, and to store the electrical energy for use to power starting, lighting, ignition ("SLI"), fuel pump, fan motor and other loads in the vehicle. The other function of the battery (110) is to act in the manner of a capacitor to smoothen the ripple generated by the alternator (101) and to provide a low impedance power source for improving the noise immunity created by the ignition circuitry and control unit.

The ripple voltage $V_{rr}$ is determined as below:

$$V_{rr} = R_2 * I_{rms}$$

where $R_2$ is the battery internal resistance $I_{rms}$ is the RMS value of charging current The relationship of ripple factor $R_f$, ripple voltage $V_{rr}$ and battery internal resistance $R_2$ is determined as below:

$$R_f = K_{r1} * V_{rr} = K_{r2} * R_2$$

where $K_{r1}$ and $K_{r2}$ are constants.

The equation shows that the ripple voltage is proportional to the battery internal resistance ($R_2$, 112) under the same charging current. Therefore, the ripple factor can be used to determine the performance of the battery (110).

The Starting Mechanism Equivalent Circuit

Figure 2:
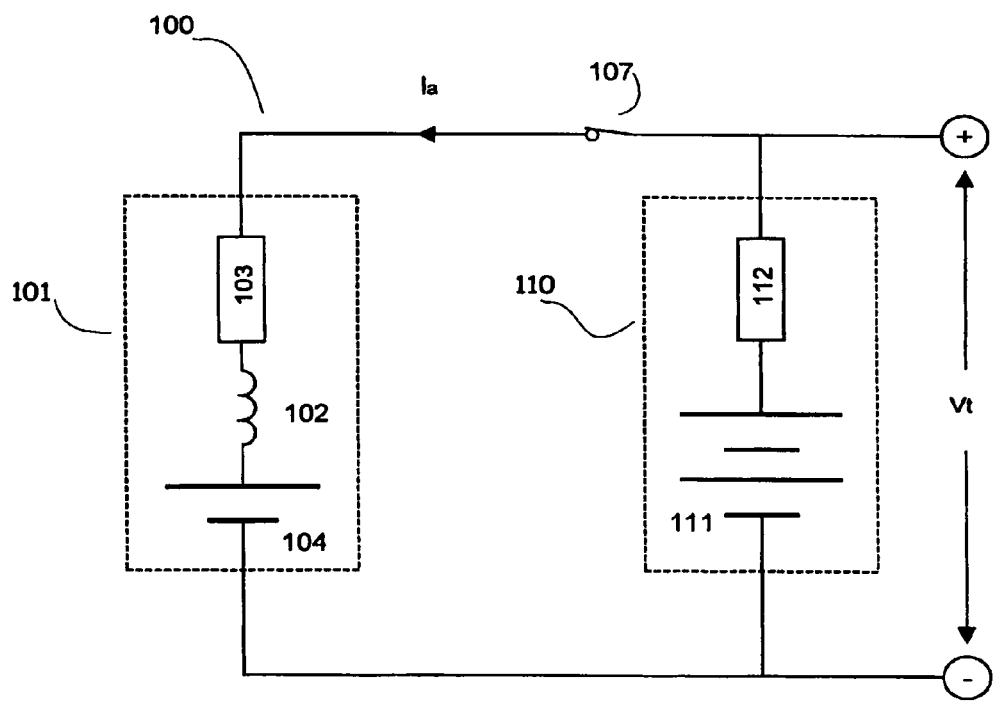
FIG. 2 is an illustration of an equivalent closed circuit of the vehicle electrical power system.

FIG. 2 is a simplified engine starting mechanism equivalent circuit. The starter (101) consists of a resistance (103) (the total ohm value of the device), a series inductance (102), and a back emf (104) of the armature. The back-emf (104) is zero when the armature is at rest.

The battery (110) consists of an ideal voltage source (111) and an internal resistance (112). The terminal voltage $V_t$ of the battery (110) is different from the ideal voltage source (111) due to voltage drop across the internal resistance (112) when the battery (110) is under load. Theoretically, the terminal voltage $V_t$ is equal to the ideal voltage source $V_o$ under a no load condition. This means that $$V_t = V_o - I*R_2$$

where I=the load current
$R_2$=battery internal resistance
$V_t \equiv V_o$ when load Current I=0. And
$V_t \neq V_o$, or $V_t < V_o$ when I≠0.

If the load current $I_1 < I_2$, then the terminal voltage $V_1 > V_2$. The voltages $V_1$ and $V_2$ are measured with correspondence to the currents $I_1$ and $I_2$. This means that the higher the current load, the lower the terminal voltage output.

The Cranking Torque and Cranking Torque Capability of the Starter

Referring to FIG. 2, at time $t_1$, under condition $0 < t_1 > \tau$ and the armature is at rest, the transient current I is simplified as follows:

$$I = V_o * t_1 / L \quad (1)$$

where $V_o$=the ideal voltage of the battery
$\tau = L/(R_1+R_2)$ the time constant of the circuitry
L=the inductance of the starter
$R_1$=internal resistance of the starter
$R_2$=internal resistance of the battery If $t_1 > \tau$, the current I is simplified as follows:

$$I = V_o / (R_1+R_2) \quad (2)$$

Referring to equation (2), the current I is limited by the starter internal resistance $R_1$ (103) and battery internal resistance $R_2$ (112). The current I is directly proportional to the torque produced by the starter. The power output $P_o$ of the battery before armature rotation can be determined as:

$$P_o = V_o * I - R_2 * I^2 \quad (3)$$

where $V_o * I$=total battery output power
$R_2 * I^2$=the internal power lost of the battery At maximum power transfer condition, $dP_o/dI=0$.

The cranking current I is equal to the maximum power output cranking current $I_n$, then the maximum power terminal voltage $V_n$ can be determined as:

$$I_n = K_n V_o / R_2$$

$$V_n = K_n * V_o \quad (4)$$

where $K_n$ is a constant

Normally, the maximum cranking current $I_n$ must be greater than the require cranking current $I_p$. If $I_R$ is the reserve cranking current, then the reserve cranking current $I_R$ can be determined as:

$$I_R = I_n - I_p$$

When the battery is degrading, the stage will be reached where the maximum cranking current $I_n$ is equal to or less than the required cranking current $I_p$. In this case the output current may not produce enough cranking torque to crank the engine.

The relationship between $V_p$, $V_n$, $I_p$ and $I_n$ is as follows:

$$V_p/V_n|I_p = I_n/I_p|V_n \quad (5)$$

With reference to equation (5), $V_p/V_n$ can be used to determine the degree of the vehicle cranking torque capability $Q_t$.

The cranking torque capability $Q_t$ is as follows:

$$Q_t = I_n/I_p = K_p * V_p/V_n \quad (6)$$

Where $K_p$ is the conversion constant.

The Gradient of Cranking Current Before Starter Rotates

If v equals the induced emf of inductor L, the transient current i of the circuit can be determined as:

$$i = (V_o - v)/(R_1 + R_2)$$

$$i = V_o/(R_1+R_2) - v/(R_1+R_2) \quad (7)$$

The differential of equation (7) with variable i and v, $$di/dt = -(dv/dt)/(R_1+R_2) \quad (8)$$

The Gradient of Cranking Voltage and Cranking Circuit Quality

The cranking voltage gradient dv/dt, when the armature is not rotating, can be determined by multiplying L to each side of equation (8), then;

$$L*(di/dt) = -L*(dv/dt)/(R_1+R_2)$$

From Lenz's law, $L*di/dt = V$ and V initially equal to $V_o$ then $$dv/dt = -V_o*(R_1+R_2)/L \quad (9)$$

Referring to equation (9), the cranking voltage rate change (gradient) of dv/dt before the armature rotates is inversely proportional to the circuit resistance. If the battery terminal is poorly contacted, or the starter brushes are worn, the total circuit resistance will increase. Therefore, the resulting cranking voltage gradient dv/dt decreases. The change to the voltage gradient dv/dt can be used to determine the condition of to cranking circuit. If the parameters of the starter and the terminal connections have not changed, then the change to the cranking voltage gradient dv/dt can be used to determine the condition of the starter engine power system.

Using the same principle, the cranking terminal voltage $V_t$ rate change is determine by using:

$$V_t = V_o - i*R_2 \text{ and } L*di/dt = V_o \text{ then}$$

$$dV_t/dt = -V_o*R_2/L \quad (9A)$$

Referring to equation (9A), the cranking terminal voltage gradient $dV_t/dt$ before the armature rotates is inversely proportional to the battery internal resistance $R_2$. If the parameter of $V_o$ and L do not change, the changes to the cranking voltage gradient $dV_t/dt$ can be used to determine the condition of the battery.

If the cranking voltage gradient $G_c=dv/dt$, (or $dV_c/dt$) and the highest recorded cranking voltage gradient is $G_{max}$, then cranking circuit quality $Q_c$ is determined as:

$$Q_c=(G_{max}/G_c)*100\% \quad (10)$$

This means that if the elements in the circuit are working perfectly, the cranking circuit quality $Q_c$ is equal to 1. If any one of the elements is degraded, the cranking circuit quality $Q_c$ will be less than 1.

From equation (8) and (9) the cranking current gradient $di/dt$ can be determined as follows:

$$di/dt=(V_o/L)$$

The gradient of the cranking current $di/dt$ is directly proportional to the initial voltage $V_o$ and inversely proportional to induction L of the circuit.

Maximum Cranking Power Output and Cranking Power Capability of Starter and Battery Once the starter rotates, the armature generates back emf $V_a$.

The armature power output $P_a$ is determined as follows:

$$P_a=V_a*I_a=V_o*I_a-(I_a^2*R_1+I_a^2*R_2) \quad (11)$$

where $I_a$=the armature current
$V_o*I_a$=total power output from the battery
$I_a^2*R_1$=the copper lost of the starter
$I_a^2*R_2$=the internal power lost of the battery
$V_a*I_a$=armature electrical power equivalent to mechanical power output of the starter The value of $V_a*I_a$ is the cranking power of the starter (101). It is proportional to the mechanical output power of the starter. The product of armature output power ($P_a=V_a*I_a$) and duration $T_d$ is the energy output of the starter (101). If the cranking power output of the starter (101) is a constant, then the longer the time required to crank, the more the energy required for the engine, and the poorer the cranking ability of the engine.

From equation 11, at maximum power transfer, if armature power output=$P_m$, armature emf=$V_m$, and $dP_m/dI_a=0$, then, $$V_o=K_1*I_a*(R_1+R_2)$$

and $$V_m=I_a*(R_1+R_2)=K_2*V_o \quad (12)$$

Where $K_1$ and $K_2$ are constants

From equation (12), under maximum power transfer, cranking armature voltage $V_m$ is proportional to ideal voltage $V_o$.

If $P_m$ is the maximum cranking power and $P_a$ is the require cranking power, then the ratio of $P_m/P_a$ is the degree of the cranking power capability $Q_p$ of the vehicle starting mechanism.

$$Q_p=P_m/P_a \quad (13)$$

The relationships between $V_a/V_m$ and $P_m/P_a$ are as follows:

$$P_m/P_a|V_m=f(V_a/V_m|P_a)$$

The cranking power capability $Q_p$ can be determined as:

$$Q_p=P_m/P_a=f(V_a/V_m) \quad (14)$$

To measure the armature voltage $V_a$ is a difficult task. It requires the sensing of the armature voltage directly. This is impractical. However, converting the cranking terminal voltage $V_{tc}$ to the armature voltage $V_a$ equivalent is relatively easy. The relationship of $V_a$ and $V_{tc}$ can be determined as:

$$V_{tc}=K_a*V_a \quad (15)$$

where $K_a$ is the conversion constant.
$V_{tc}$ is the cranking terminal voltage when armature rotating Another method to determine the cranking power capability is to determine the ratio of cranking terminal voltage $V_{tc}$ and maximum cranking power transfer terminal voltage $V_{tm}$.

From equation (12), under conditions of maximum power transfer, the battery internal resistance $R_2$ and starter internal resistance $R_1$ must be equal. The maximum cranking power output terminal voltage $V_{tm}$ is as:

$$V_{tm}=K_m*V_m \quad (16)$$

where $K_m$ is the conversion constant

Normally, the cranking power of the starting mechanism is below the maximum power. This means that the maximum cranking power $P_m$ must greater than the required cranking power $P_a$. The reserve power $P_R$ can then be determined as:

$$P_R=P_m-P_a$$

When a battery is degrading, once the maximum cranking power $P_m$ is equal to the cranking power $P_a$, then the reserve power $P_R$=0 this means the cranking operation is close to the maximum power. Any increase in the load of the engine (105) will cause the starter power output do drop thus causing cranking failure.

The ratio of $V_{tc}/V_{tm}$ can be used to determine the degree of cranking power capability of the vehicle starting mechanism. The relationship between equation (15) and (16) is as:

$$V_a/V_m=K_t*V_{tc}/V_{tm} \quad (17)$$

Where $K_t$ is a constant factor, and
$K_t=K_a/K_m$
The cranking power capability $Q_p$ is derived as follows:

$$\begin{aligned} Q_p &= P_m/P_a \quad (18) \\ &= f(V_a/V_m) \\ &= f(K_t*V_{tc}/V_{tm}) \end{aligned}$$

where $P_a$ is the cranking power output of the starter
$P_m$ is the maximum cranking power output of the starter Referring to FIG. 1, the embodiment illustrated has a microprocessor (200), reference timer (204), memory (203), key-pad (205), input controller (300), power supply (303), voltage reference (304), voltage pre-scale network filter (305), temperature reference (306), engine speed sensor (307), waveform detector (308), output controller (400), output device display (501), full colour LED (502), speaker (503), infrared port (504) and computer link port (505).

The electrical power system (100) under test is connected to a high input impedance voltage pre-scale network filter (305). It is a low pass filter and a scaler to produce a correct voltage ratio, and to filter out high frequency noise before feeding the signal into the analogue-to-digital converter (ADC, 301), waveform detector (310) and voltage gradient detector (302).

The engine speed sensor (307) is used to detect the speed of the engine. It is optional for a gasoline engine but is required for a diesel engine as a diesel engine does not have an ignition pulse and thus the system cannot detect the engine speed.

The analog-to-digital converter (301) converts an analogue signal to a digital signal, and feeds the information to microprocessor (200) through the data-bus (208). The microprocessor (200) gates the ADC (301) under multiplexer mode.

Figure 4:
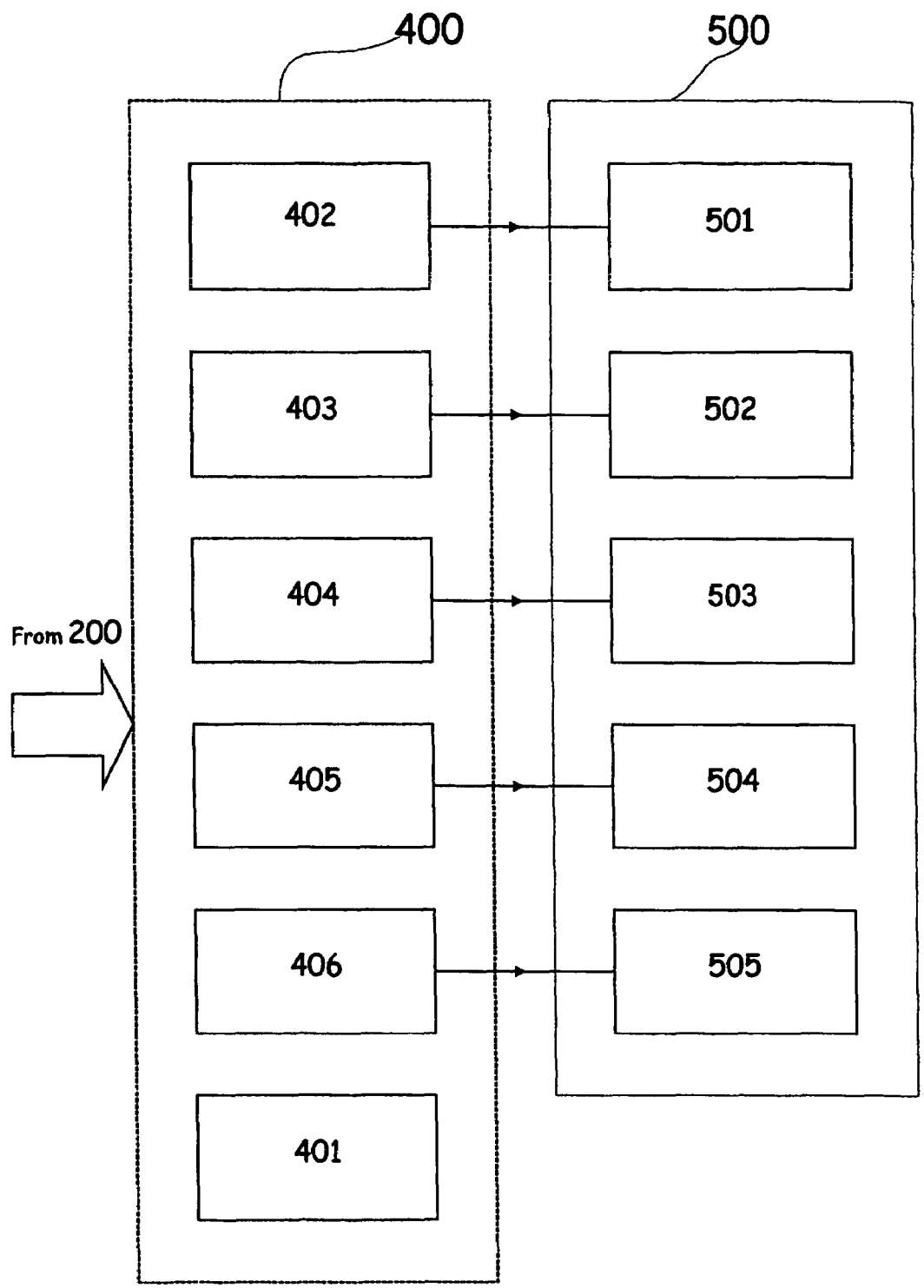
FIG. 4 is an illustration of a signal flow output controller to output driver.
Figure 5:
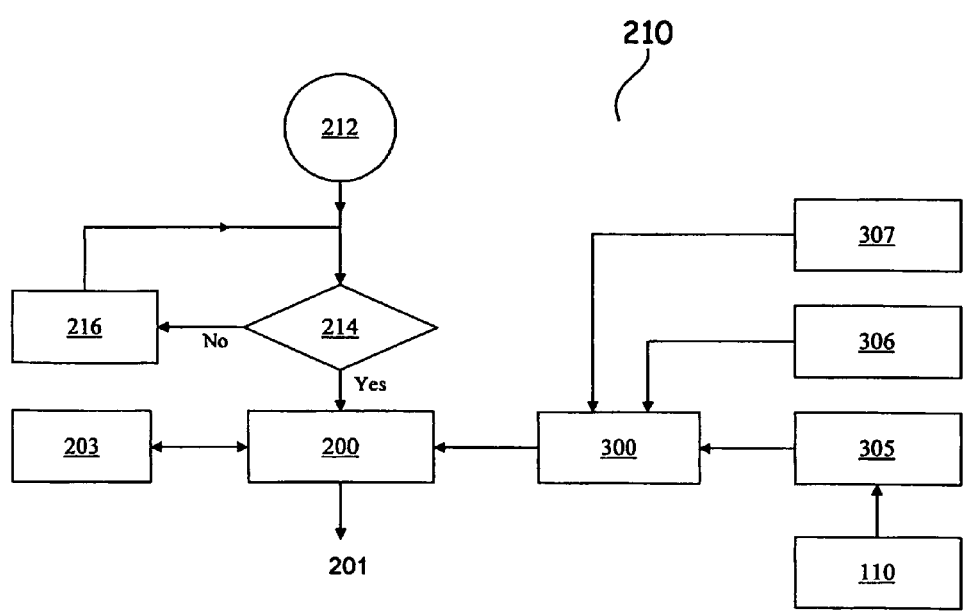
FIG. 5 is a flowchart of a first part.
Figure 6:
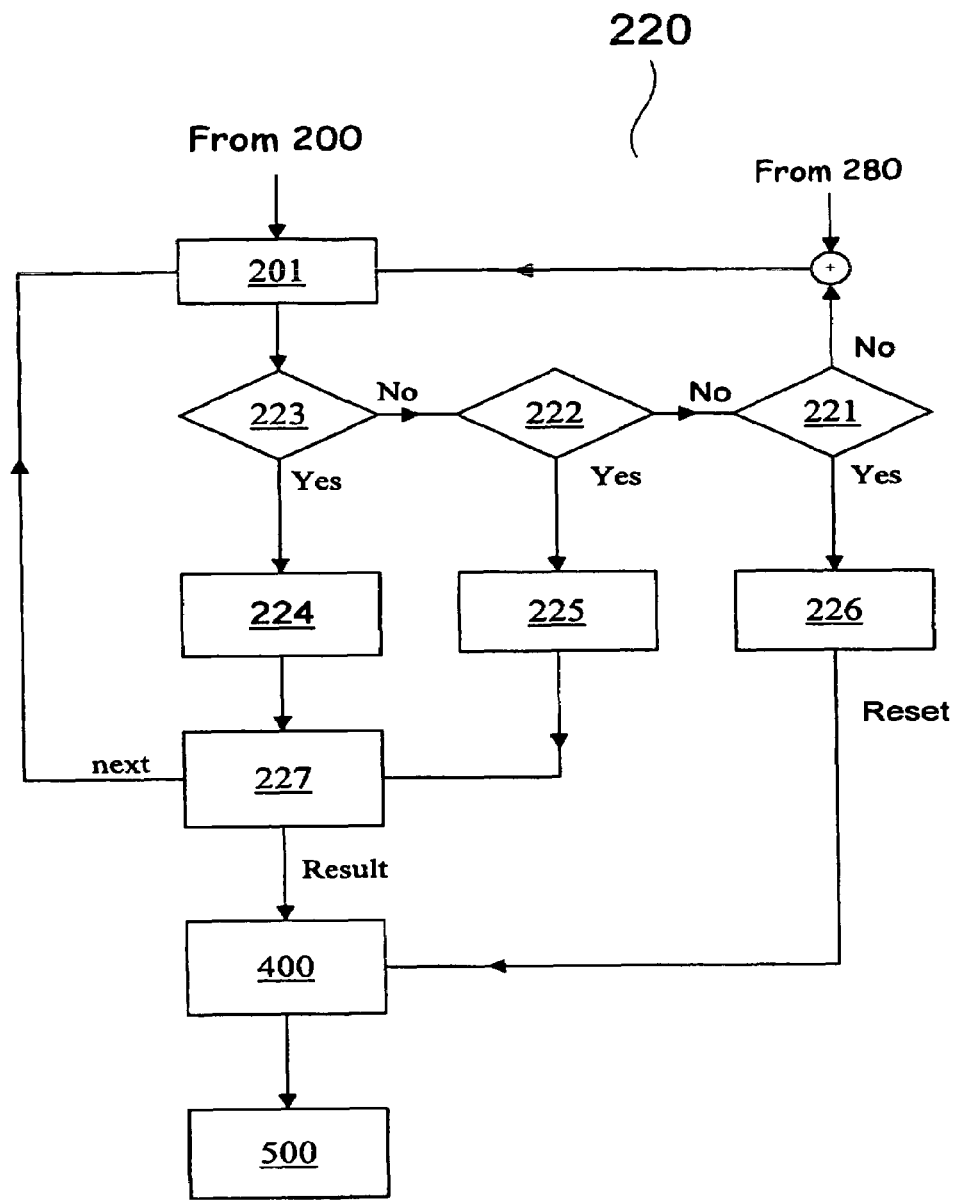
FIG. 6 is a flowchart of a second part.
Figure 7:
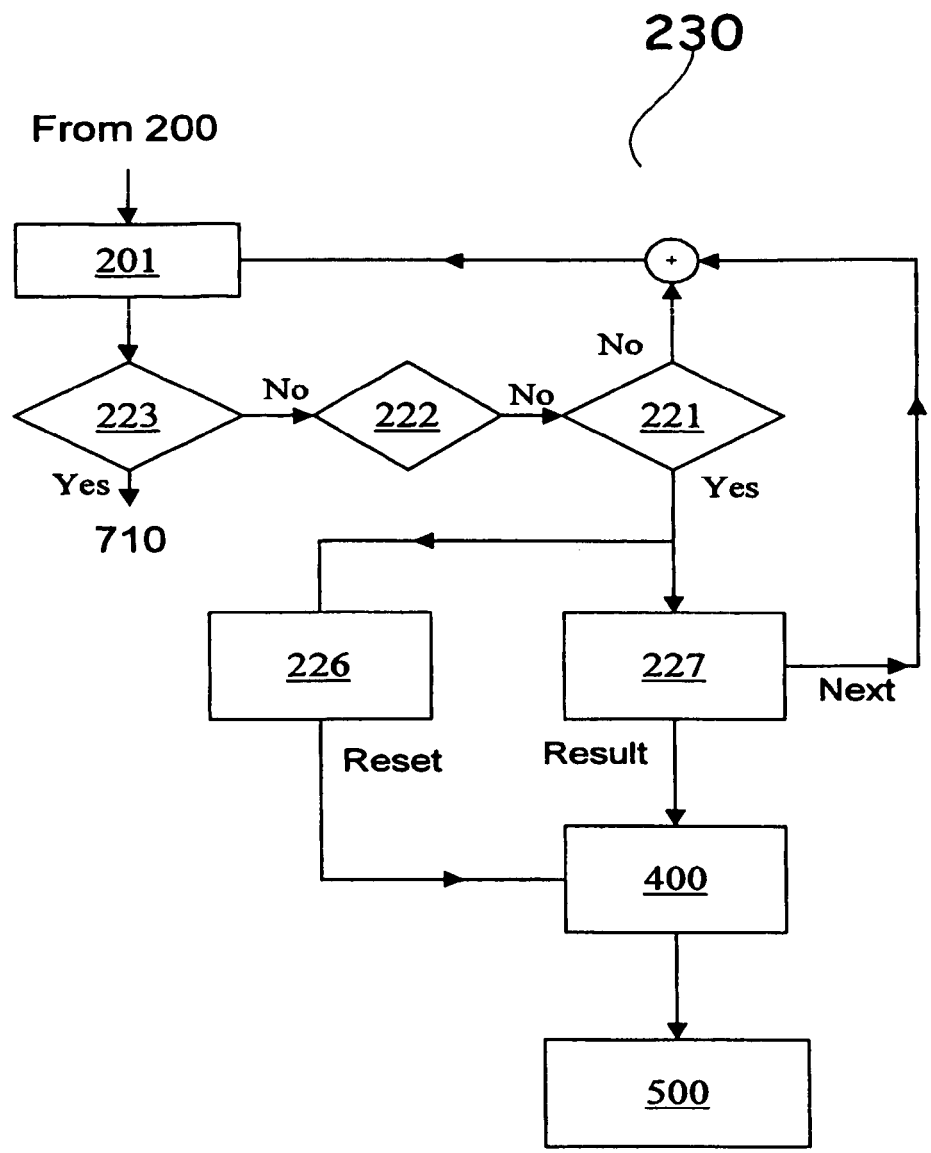
FIG. 7 is a flowchart of a third part.

Referring to FIG. 4, the output controller (400) manages interface output from microprocessor (200) through the data bus (208). The digital-to-analogue converter (DAC, 401), has as its main function the conversion of digital signals to analogue signals. The character generator (402) generates messages according to test results with a data latch to drive the LCD display (501). The character generator (402) and the display (501) may be integrated and may be directly controlled by microprocessor (200) through the data bus (208).

The tone generator (403) generates sound tones or music according to test results and drives the speaker or speakers (502). Different tones may be used to identify different conditions of the vehicle electrical power system.

The colour pattern generator (404) generates different colour mixtures, light intensities, and on-off intervals to drive the colour LED (503). Different colour patterns may also be used to indicate the condition of the vehicle electrical power system.

The infrared printing interface (405) is an interface driver to drive the infrared transmitter (504) to provide a hard copy of a report on the condition of the vehicle electrical power system.

The computer interface driver (406) is connected to the port (505) to provide a data link with a computer to send reports on the condition of the vehicle electrical power system to the computer for storage and/or analysis.

Figure 2A:
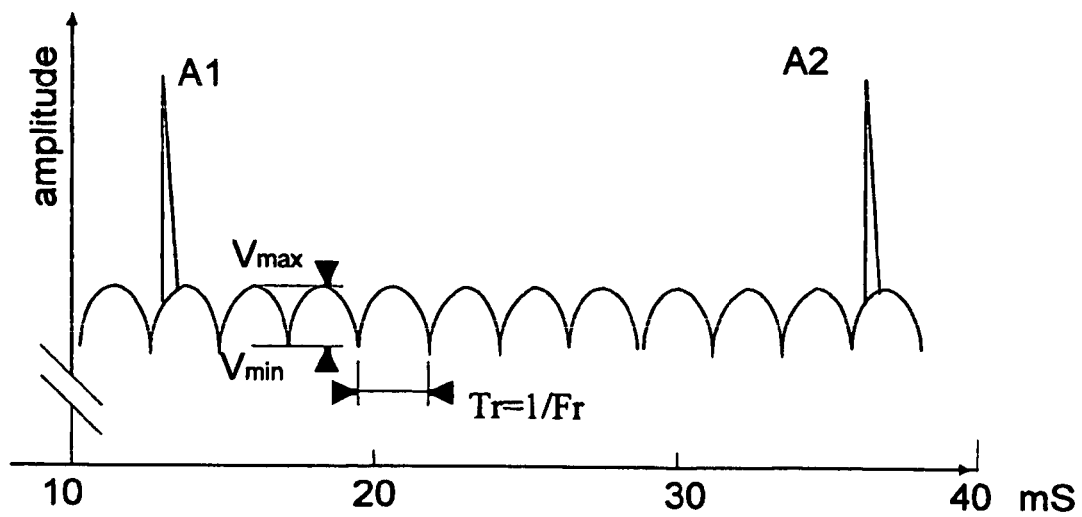
FIG. 2A is an illustration of an ignition pulse and ripple waveform.

The waveform detector (308) is a device to separate and detect the ignition impulse and the sinusoidal signal of the alternator ripple. Referring to FIG. 2A, a signal waveform is obtained from the battery (110) terminals. It consists of impulse signals $A_1$, $A_2$ generated by the ignition circuit, and a sinusoidal ripple signal generated by the alternator (106). The ignition pulse is narrow and sharp, and the period of $A_1$ and $A_2$ varies with engine speed. The ignition pulse frequency can be used to determine the engine speed $S_e$. If $F_i$ is the ignition pulse frequency, and C is the number of cylinder of a four-stroke engine, the relationship is:

$$S_e = K_e * F_i / C,$$

where $K_e$ is a constant.

For example, if C=4 and $F_i$ is measured reading 33 Hz, if $K_e$ is 120, then the speed of the engine $S_e$ can be determined as follow:

$$S_e = 120*33/4 = 990 \text{ RPM}$$

The ripple factor $R_f$ can be determined as:

$$R_f = (V_{rr}/V_{ave})*100\% \quad (19)$$

Figure 2B:
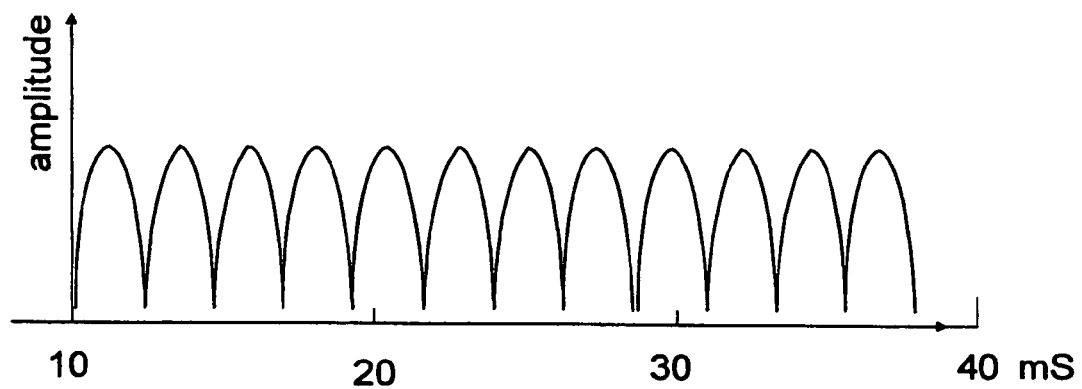
FIG. 2B is an illustration of an alternator ripple waveform.
Figure 2C:
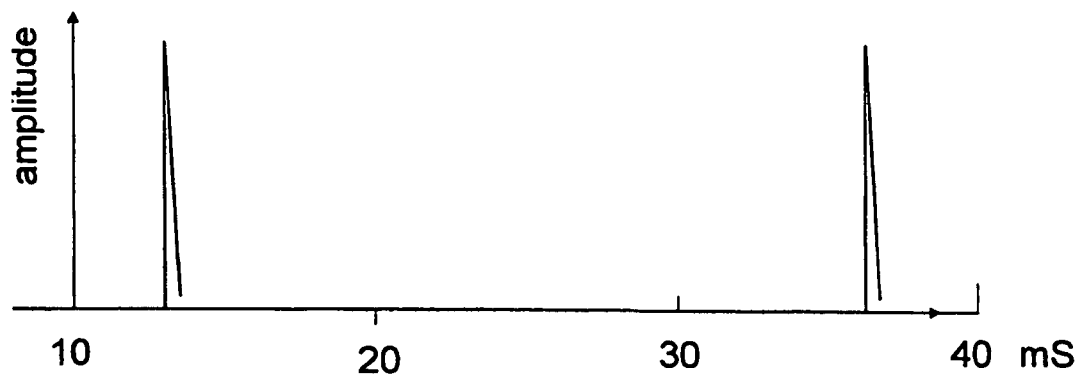
FIG. 2C is an illustration of an ignition pulse waveform.

FIG. 2B is the ripple voltage waveform and FIG. 2C is the engine ignition pulse waveform as separated by the waveform detector (308).

To detect a diesel engine running status, a speed sensor (307) is necessary. The engine speed detector is a magnetically coupled pulse generator, which generates a pulse waveform according to the crankshaft position and speed.

The waveform detector and engine speed sensor can provide the following information:

1) engine ignition pulse, or engine rotating pulse;
2) engine speed;
3) engine running status;
4) ripple voltage;
5) speed of the alternator; and
6) alternator working status.

Figure 3:
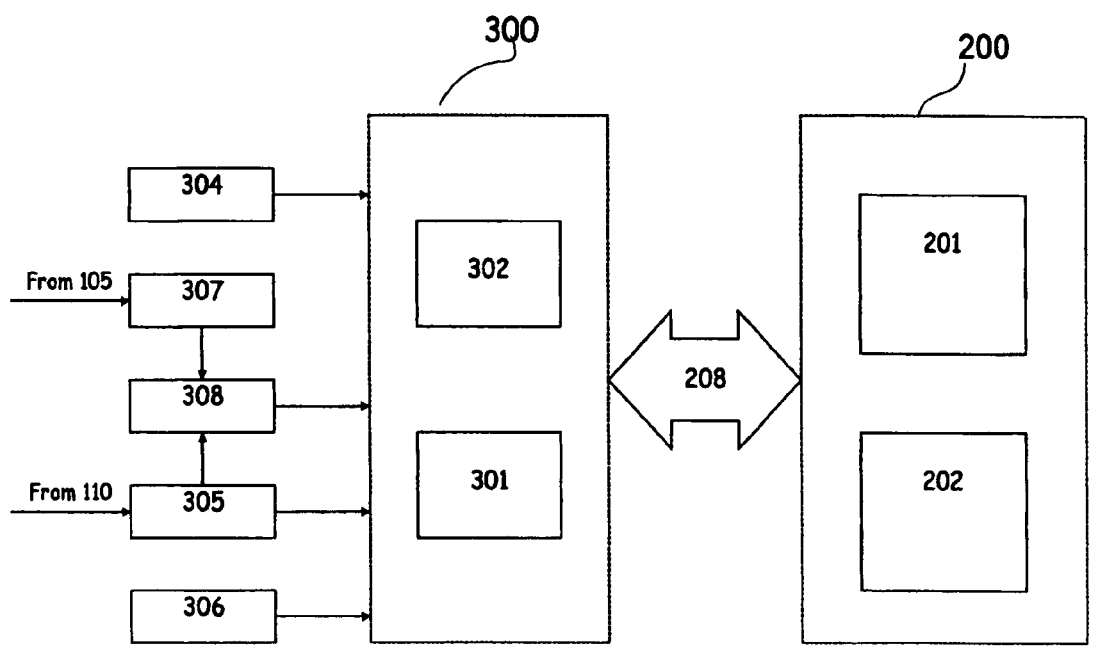
FIG. 3 is an illustration of a signal flow input controller to microprocessor.

Referring to FIG. 3, the voltage gradient detector (VGD, 302) is a device that is highly sensitive to the voltage change gradient. It provides the gradient status and value when the battery (110) terminal voltage changes. The microprocessor (200) will combine, compute and analyze data from ADC (301), waveform detector (308), VGD (302) and speed sensor (307), and provide a control signal to the ADC (301) for data conversion.

The microprocessor (200) provides the following information:

1. voltage gradient (G) status of the terminal voltage (G>0, G<0 and G=0);
2. interval or duration ($T_d$) between two voltage gradient changes;
3. voltage change rate or gradient (dv/dt);
4. battery terminal voltage ($V_t$);
5. minimum terminal voltage ($V_{min}$) when the engine is running;
6. minimum terminal voltage ($V'_{min}$) when the engine is not running;
7. maximum terminal voltage ($V_{max}$) when the engine is running;
8. maximum terminal voltage ($V'_{max}$) when engine is not running;
9. average terminal voltage $V_{ave}$;
10. amplitude of the ripple voltage $V_{rr}$;
11. frequency of the ripple voltage $F_r$;
12. ripple factor of the ripple signal $R_f$;
13. regulator working status;
14. engine cranking status (this may include one or more of: starter engaged/disengaged, cranking, cranking passed/failed);
15. ignition pulse, or engine rotating pulse;
16. ignition pulse, or engine rotating pulse frequency $F_i$;
17. engine speed $S_e$;
18. engine running status $S_e=0$ or $>0$;
19. alternator speed $S_a$; and
20. alternator running status $S_a=0$ or $>0$.

Further more, the microprocessor (200) can automatically determine the condition and status of the electrical power system of the vehicle.

In the following gasoline system example, the judgement logic may be determined as follows:

| Engine Status | Measurement Data |
|---|---|
| Ignition power on→off | |
| when $S_e = 0$ | $V_t \leq V_o$, and $G > 0$ change to $G = 0$ |
| when $S_e > 0$ | $S_e > 0$ change to $S_e = 0$ |
| Ignition power off→on | $V_{t1} < V_{t2}$ and $G < 0$ change to $G = 0$, |
| Cranking switch off→on | $G = 0$ change to $G < 0$ |
| Cranking switch on→off | $G = 0$ change to $G > 0$ |
| Cranking duration $T_d$ | Time taken from crank starting to crank ending |
| Engine cranking failure | after cranking duration $T_d$, engine speed $S_e = 0$ |

-continued

| Engine Status | Measurement Data |
|---|---|
| Engine cranking successful | after cranking duration $T_d$, engine speed $S_e > 0$ |
| Engine running | Ignition pulse > 0 or Ripple > 0 or $S_e > 0$ |
| Alternator malfunction | $S_e > 0$ and ripple = 0 or $S_e > 0$ and $V_t < V_o$ |
| Alternator partially function | $S_e > 0$, ripple > 0 and $V_t < V_o$ or $S_e > 0$ and $R_f > 5\%$ |
| Charging system working Normal Regulator out of order | $1.2 V_o > V_t > V_o$ and $R_f < 1\%$ |
| over voltage | $S_e > 0$, and $V_t > 1.2 V_o$ |
| under voltage | $S_e > 0$, and $V_t < V_o$ |

The cranking torque capability $Q_t$ and cranking circuit quality $Q_c$ of the starter (101) and battery (110) circuit may also be determined. The cranking torque capability $Q_t$ and cranking circuit quality $Q_c$ are useful parameters for judging the static torque performance, and quality of the elements of the starting mechanism. The performance of the starting mechanism may be monitored, and defective elements in the system detected prior to failure.

Figure 8:
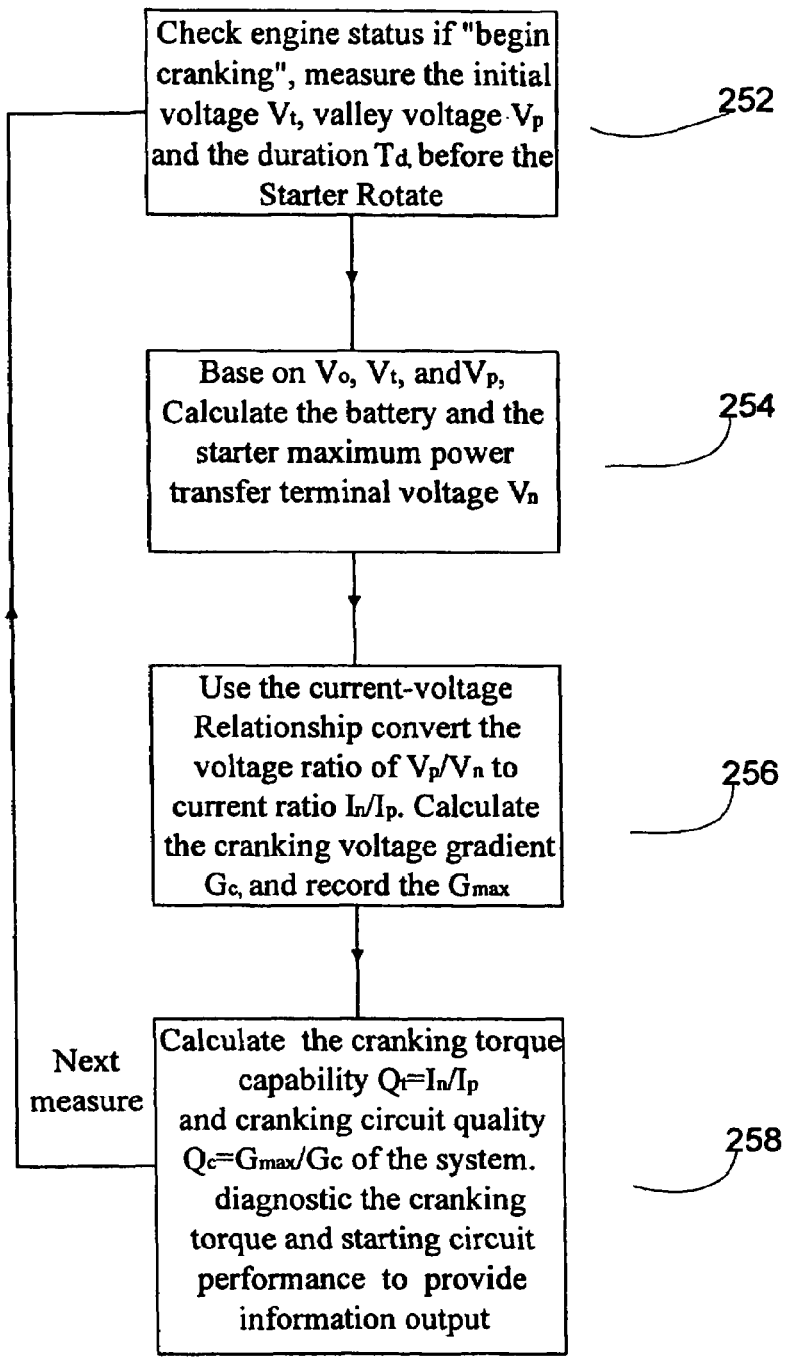
FIG. 8 is a flowchart of cranking torque capability and circuit quality.

Referring to FIG. 8, there is shown a simplified functional flowchart (250) for determination of cranking torque capability and cranking circuit quality.

In step 252 the terminal voltage, and duration of the time during initial cranking (when the engine status "engine began cranking"), are detected and measured. The initial voltage $V_t$ before cranking is recorded, as is the lowest terminal voltage $V_p$ and the duration $t_r$ before armature rotation.

The maximum power transfer current $I_n$ is calculated (254) as is voltage $V_n$, based on the collected data $V_o$, $V_t$, $V_p$ and $t_r$.

The voltage ratio of $V_p/V_n$ is converted to the current ratio $I_n/I_p$ (256) and the cranking voltage gradient $G_c$ is determined as follows:

$$G_c = vd/dt = -(V_t - V_p)/t_r$$

where $t_r$=time taken from $V_t$ to $V_p$.

The highest voltage gradient $G_{max}$ will be recorded.

The cranking torque $Q_t$ and cranking circuit quality $Q_c$ is calculated (258) as follows:

$$Q_t = I_n/I_p = K_p * V_p/V_n$$

where $K_p$ is a conversion constant.

$$Q_c = G_{max}/G_c * 100\%$$

where $G_{max}$ is the recorded highest value of $G_c$

This function also compares $Q_t$ and $Q_c$ with the acceptable values preset in the system to determine the acceptability of the measured values of the cranking circuit quality $Q_c$, cranking torque capability $Q_t$, condition of battery, starter, and connector. The determination will be used for final output later, preferably in the form of one or more of colour lights, musical tones, and messages. The results are recorded with a date-time log for future use. The future use may include functions such as event tracing, or auditing.

The cranking power capability $Q_p$ of the electrical power system of the vehicle can also be determined. This includes the starter (101) that, together with battery (110), determines the cranking ability of the engine.

The cranking power capability $Q_p$ is a useful parameter to determine the dynamic power output capability of the battery (110) and starter (101). It is a real time data measurement under actual operating conditions. It is an accurate determination of the cranking capability of the vehicle. An early warning of a low cranking capability of any component in the system can also be determined accurately.

Figure 9:
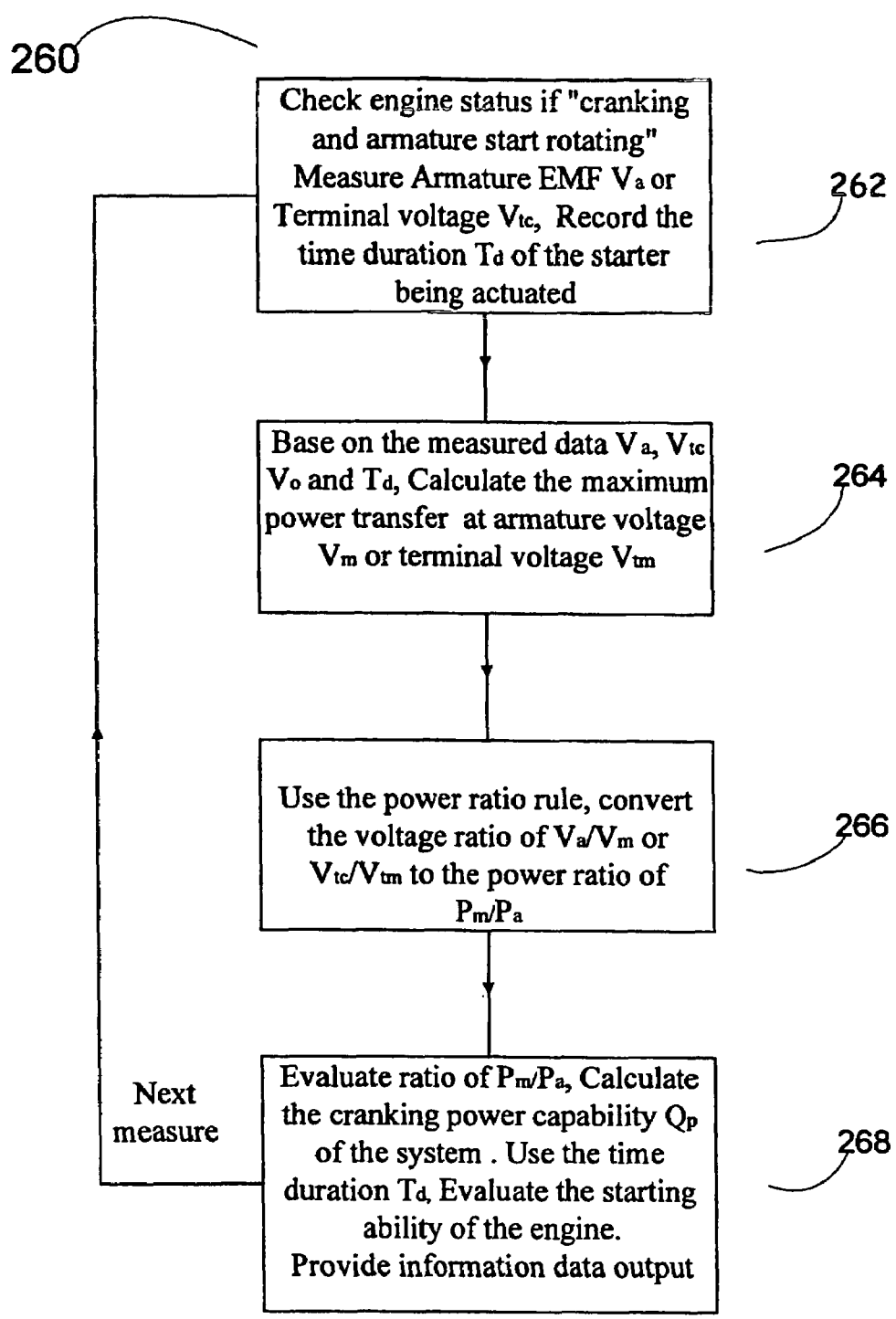
FIG. 9 is a flowchart of cranking power capability and engine cranking ability.

FIG. 9 is a simplified flowchart (260) for the determination of cranking capability.

The armature back emf $V_a$, terminal voltage $V_{tc}$, and duration $T_d$ (time from when the armature begins rotating until the starter is disengaged from the engine) can be measured and recorded (262).

The maximum power transfer armature back emf $V_m$, maximum power transfer terminal voltage $V_{tm}$, the armature voltage ratio $V_a/V_m$ and the terminal voltage ratio $V_{tc}/V_{tm}$ are also calculated (264) and the armature voltage ratio $V_a/V_m$ or terminal voltage ratio $V_{tc}/V_{tm}$ is converted to the armature power ratio $P_m/P_a$ (266). The cranking power capability $Q_p$ can be derived as follows:

$$Q_p = P_m/P_a = f(V_a/V_m)$$

$$Q_p = P_m/P_a = f(K_t * V_{tc}/V_{tm})$$

where $K_t$ is a constant.

The cranking power capability $Q_p$ and the cranking duration $T_d$ of the engine can be analyzed (268). This is used to diagnose the cranking power capability of the starting mechanism, and the engine cranking ability respectively. $Q_p$ and $T_d$ are also compared with the acceptable values preset in the system to determine the acceptance of the measured values of cranking power capability $Q_p$ and the engine cranking ability. The determination will be used for output later. This is preferably in the form of one or more of colour lights, musical tones and messages. The results are recorded with date-time log for future use. The future use may include functions such as event tracing or auditing.

Engine speed $S_e$, alternator speed $S_a$, terminal voltage $V_t$ and ripple factor $R_f$ may be used to determine and diagnose the working condition of an alternator, battery, and related components, such as, for example, drive belt, rectifier circuit and the regulator. Battery charging status, the deterioration of the battery, low electrolyte level, and insufficient alternator output power, can also be detected.

Figure 10:
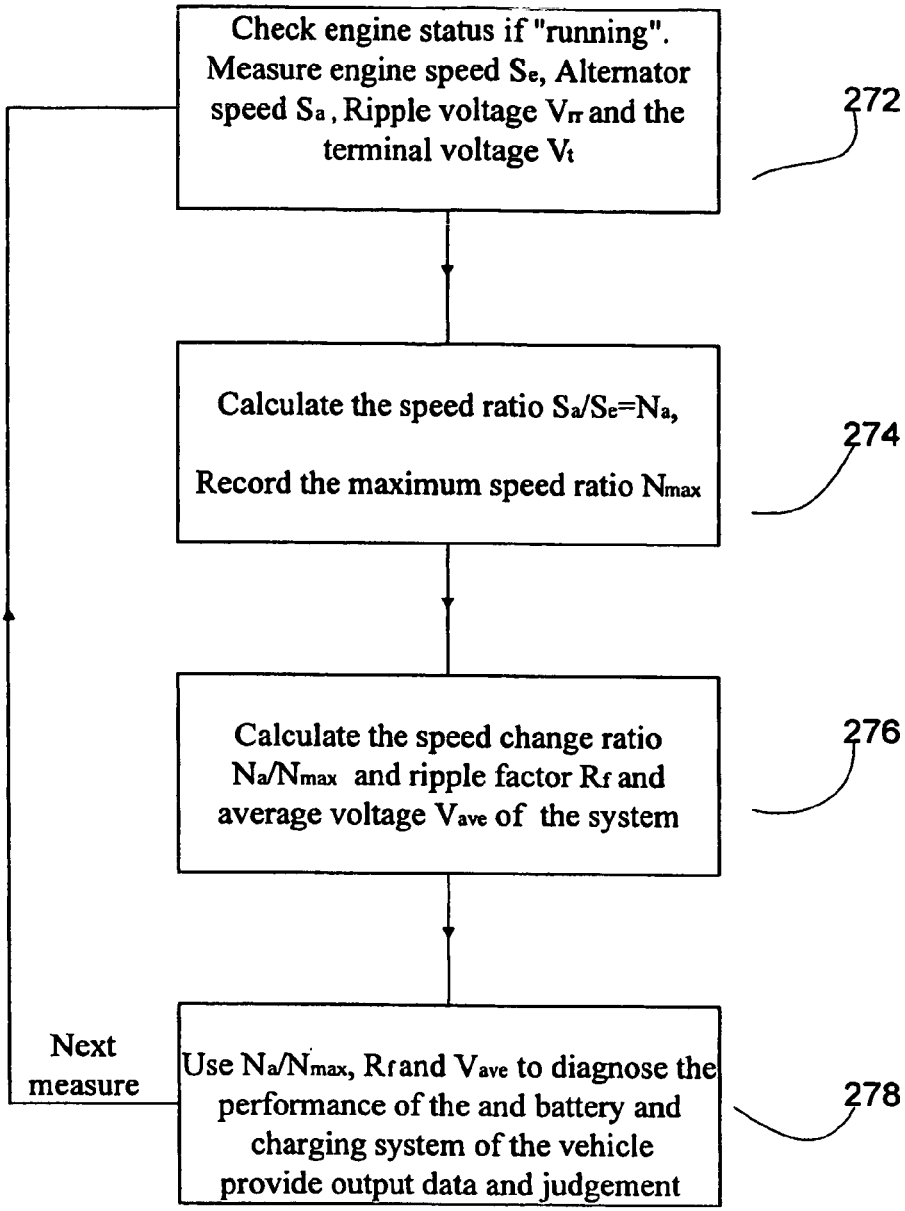
FIG. 10 is a flowchart of alternator charging performance.

Referring to FIG. 10, the flowchart 270 shows the process for determining the working condition of the alternator and battery with the engine running.

The engine speed $S_e$, the alternator speed $S_a$, the terminal voltage $V_t$, the maximum and minimum terminal voltage, $V_{max}$ and $V_{min}$, are all measured respectively when engine is running (272).

The ripple voltage $V_{rr}$, the speed ratio of alternator and engine $N_a = S_a/S_e$, care calculated (274) and record the corresponding maximum speed ratio $N_{max}$ recorded.

The average voltage $V_{ave}$, ripple factor $R_f$ and the speed ratio change rate $S_R$ are calculated (276) as follows:

$$R_f = (V_{rr}/V_{ave}) * 100\%$$

$$S_R = N_a/N_{max}$$

The speed ratio $N_a$ is normally a constant, and $N_a = N_{max}$. If $N_a/N_{max} < 1$ it shows that the alternator may have a fault. This may be, for example, when the alternator drive belt is loose and slippage results. In that case $N_a$ will decrease. If one phase of the alternator is not functioning, $N_a$ will decrease to one third of the normal value.

The ratio $N_a/N_{max}$, the terminal voltage $V_t$, the engine speed $S_e$ and the ripple factor $R_f$ are analyzed (278) to determine the alternator and battery working conditions. $N_a/N_{max}$=$R_f$ and $V_t$ are compared with the acceptable values preset in the system to determine the acceptance of the measured values of speed ratio change rate $N_a/N_{max}$, ripple factor and terminal voltage. The determinations will be used for a final output in the form of one or more of colour lighting, musical tones and messages. The results are recorded with date-time log for future use, such as event tracing or auditing.

Figure 11:
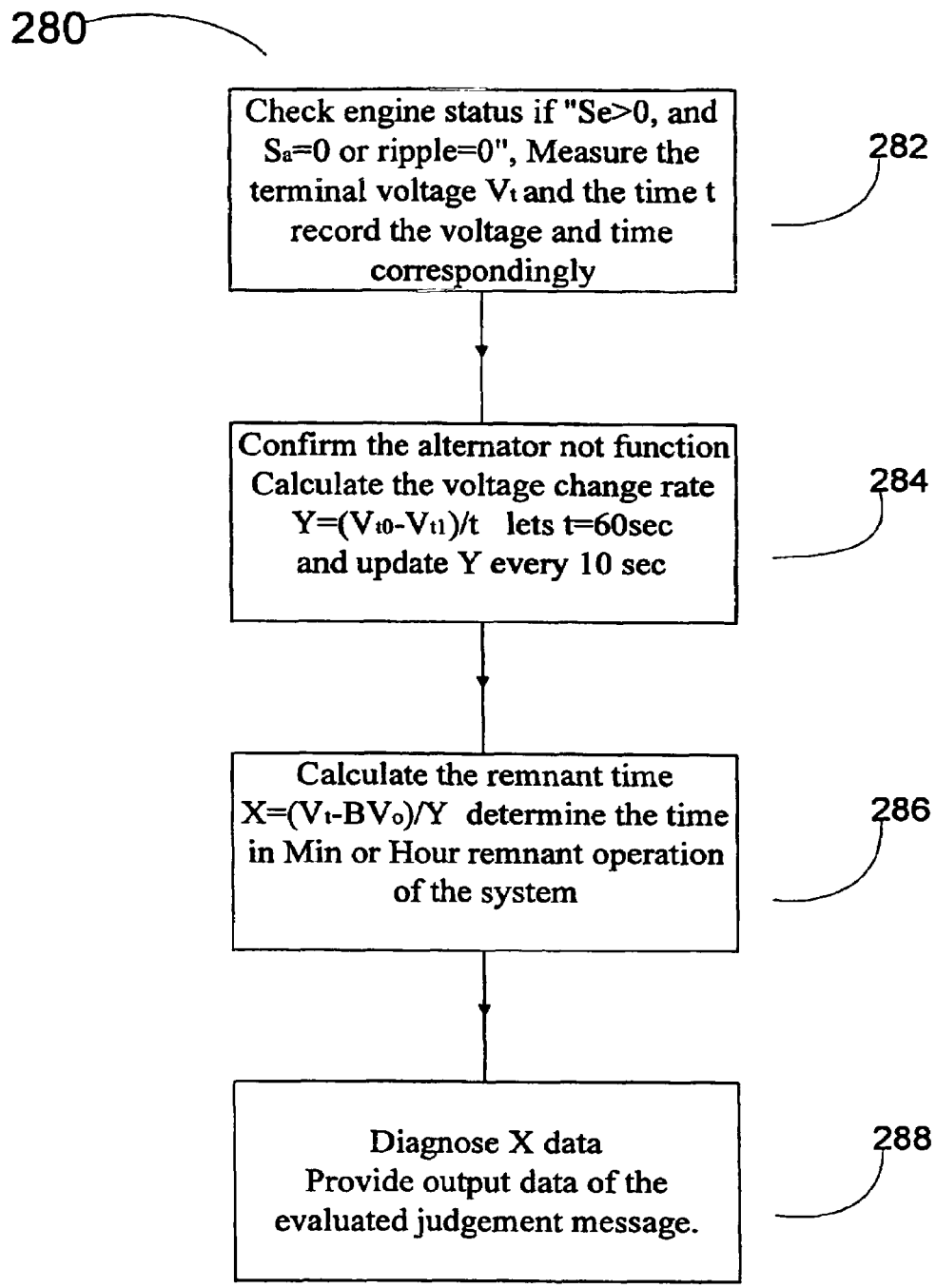
FIG. 11 is a flowchart of remnant operating time.

The discharge time remaining for the battery after an alternator breakdown, and during normal operation, can also be determined. By making use, of the engine running status, alternator working status, terminal voltage and voltage gradient it is possible to determine a remaining battery discharge time. It will be updated, and will self-correct, as a result of input of data relating to dynamic load changes and battery capacity changes. This may provide information to the user at fixed intervals on a continuous basis. FIG. 11 (280) is a flowchart for determination of the remaining battery operating time.

The battery terminal voltage $V_t$, is measured and the engine running ($S_e$>0) status and alternator working status are determined (282). If the alternator (106) working status is abnormal, such $S_a$=0, ripple=0 or low voltage, the battery voltage $V_t$ and the time t are recorded.

Terminal voltage change rate, Y, is detected and tracked (284) if the alternator is confirmed as operating abnormally. The battery discharge voltage gradient Y is calculated:

$$Y=(V_{t0}-V_{t1})/t$$

where $V_{t0}$ is previous terminal voltage
$V_{t1}$ is next terminal voltage
t=fixed time interval between data $V_{t0}$ to $V_{t1}$ The remaining time, X, is calculated (286) based on the voltage discharge rate Y and the terminal voltage $V_t$. X can be determined as follows:

$$X=(V_{t1}-\beta V_o)/Y$$

where $V_{t1}$ is the voltage corresponding to Y
$\beta V_o$ is the end of discharge voltage (percentage of ideal voltage $V_o$)
$\beta$ is expressed in percentage.

It is diagnosed at 288. It is refreshed at regular intervals such as for example, every 1, 10 or 120 seconds, due to dynamic load change. If the result is X≦10 minutes, the judgment of the engine status is that the engine may soon break down. The result may be output preferably in the form of one or more of colour lighting, musical tones and messages. The results are recorded with a date-time log for future use. The future use may include functions such as event tracing or auditing.

Referring to FIG. 4, the output controller (400) decodes the data from microprocessor (200) through databus (208) to control devices including a digital to analogue converter (DAC, 401), a character generator (402) to drive the LCD (501), a tone/music generator (403) to drive the speaker (502), an LED colour pattern generator (404) to drive the colour LED (503), an infrared printing interface (405) to drive the infrared transmitter (504), a computer link interface (406) with interface port (505).

The display may provide comprehensive information. Preferably the report cycle starts when the ignition is switched on, and reports continue at regular intervals until the ignition is switched off. The reports may be continuous.

There may be up to five modes of output:

1. Message Display
   Message displayed may include information on one or more of:
   present battery terminal voltage;
   initial battery voltage before load;
   cranking circuit quality;
   cranking torque capability;
   cranking power capability;
   minimum voltage at engine off;
   maximum voltage at engine off;
   minimum voltage at engine running;
   maximum voltage at engine running;
   ripple factor; and
   battery remaining operating time when alternator failure;
   and warnings of the battery terminal voltage is over or under the pre-set limits;
   limited or poor cranking circuit quality;
   limited or poor cranking torque capability;
   limited or poor cranking power capability;
   alternator malfunction;
   alternator rectifier out of order;
   remnant operating time of the battery if the engine running but the battery is not charging;
   limited remnant time;
   limited reserve cranking energy; and
   alternator drive belt loose.

2. Visible Colour Pattern Signal
   The colour pattern generator (404) combines the colour, duration time and intensity of light to generate various colour patterns. Different colour patterns indicate different vehicle electrical power conditions and performances. The colour pattern generator (404) modulates a small number such as, for example, two or three primary colours. They are mixed proportionally to correspond to the battery (110) voltage. It therefore acts a colour-voltmeter.
   For example, the colour-voltmeter may modulate the red and green LED illumination duty cycle according to the voltage range from $V_1$ to $V_2$. The colour may remain red if the voltage is less than $V_1$, and may remain green if the voltage is more than $V_2$. Where $V_1$ indicate weak battery and $V_2$ indicate serviceable battery.
   The same concept may be used to modulate two or three primary colours (preferably different primary colours) to indicate the level of cranking torque capability and cranking power capability. These may be, for example, yellow and blue; orange and white; and so forth. Upon it being determined that the alternator and battery are in good condition, the LED may be reduced to an intensity as a percentage of full intensity, the percentage being in a range of 0% to 75%.

3. Audible Tone or Musical Signal
   The music tone generator (403) may generate different musical tones and/or tone intervals to indicate the condition of the vehicle electrical power circuit, especially under abnormal situations, to alert users. For example, a shrill, constant musical tone may indicate the system is abnormal, as in an alarm bell. A gentle musical tone or silence may indicate that the vehicle electrical system is normal.

4. Infrared Printing Hard Copy Output

The hard copy can be generated via infrared transmitter (405) to a printer for report with time/date logging, title of record, and detailed data for future auditing and use.

5. Computer Interface Data Output

The detailed data generated by the system can also be transferred via a communication driver (406) and communication port (505) to a computer for continuous data storage, and data processing.

Whilst there has been described in the foregoing description a preferred embodiment of the present invention, it will be understood by those skilled in the technology that many variations or modifications in details of design, construction or operation may be made without departing from the present invention.

The invention claimed is:

1. Apparatus for monitoring an electrical power supply system of a vehicle, the vehicle having a battery and internal combustion engine, an alternator, and a starter; the apparatus comprising:
   (a) a filter for determining the battery terminal voltage when the vehicle ignition is turned on;
   (b) a voltage gradient detector for detecting phase and gradient change of the battery terminal voltage when the vehicle ignition is on;
   (c) a waveform detector for detecting and separating different waveforms when the vehicle ignition is on;
   (d) an engine-rotating sensor for sensing a speed of the internal combustion engine when the vehicle ignition is on;
   (e) a processor for processing at least one of the battery terminal voltage, the phase and gradient change, the different waveforms, and the speed of the internal combustion engine for providing an output indicative of a condition of the electrical power supply system.

2. Apparatus as claimed in claim 1, further including an output controller for decoding data from the processor to control at least one device; the at least one device including one or more selected from the group consisting of a digital-to-analogue converter, a character generator for driving an LCD, a tone generator for driving a speaker, an LED color pattern generator for driving a color LED, an infrared printing interface for driving an infrared transmitter, and a computer link interface for coupling to an output port when the vehicle ignition is on.

3. Apparatus as claimed in claim 1, further comprising a temperature sensor for detecting ambient temperature.

4. A system for monitoring an electrical power supply system of a vehicle, the vehicle having a battery, an internal combustion engine, an alternator and a starter, the system including:
   (a) determining the battery terminal voltage when the vehicle ignition is on;
   (b) detecting phase and gradient change of the battery terminal voltage when the vehicle ignition is on;
   (c) detecting and separating different waveforms when the vehicle ignition is on;
   (d) sensing a speed of the internal combustion engine when the vehicle ignition is on;
   (e) processing at least one of the battery terminal voltage, the phase and gradient change, the different waveforms, and the engine speed; and providing an output indicative of the condition of the electrical power supply system.

5. A system as claimed in claim 4, comprising determining a status of the internal combustion engine, the status being selected from the group consisting of: not running, cranking, running, and normal.

6. A system as claimed in claim 5, wherein the status is not running if there is satisfaction of one or more selected from the group consisting of:
   (a) the battery terminal voltage when the vehicle ignition is on is less than the battery terminal voltage when the ignition is off;
   (b) the gradient change is in a range from less than zero to zero;
   (c) a ripple waveform is zero; and the speed of the internal combustion engine is zero; and
   wherein the status is cranking if there is satisfaction of one or more selected from the group consisting of:
   (a) the gradient of the battery terminal voltage is lower than a predetermined value;
   (b) the battery terminal voltage with the ignition on is at a predetermined value below of the battery terminal voltage with the ignition off; and
   (c) the speed of the internal combustion engine is zero.

7. A system as claimed in claim 5, wherein a time duration for the starter cranking the internal combustion engine is determined by one or more of:
   (a) determining the time duration between the gradient change of the battery terminal voltage changing from a significant figure when negative to the significant figure when positive;
   (b) the time duration before and after battery voltage gradient changes;
   (c) the terminal voltage being constant, and
   (d) the speed of the internal combustion engine moves from zero to a positive figure.

8. A system as claimed in claim 7, wherein:
   if the time duration exceeds a predetermined time, the internal combustion engine will have a poor cranking ability;
   if, after the predetermined time, the speed of the internal combustion engine is above a pre-set minimum the engine status is running;
   if the ripple waveform is greater than zero, the engine status is running; and
   if after the predetermined time the speed of the internal combustion engine is zero, the engine status is that cranking failed.

9. A system as claimed in claim 6, wherein an alternator status is determined from the internal combination engine status and the ripple waveform; and if the engine status is running, and the ripple waveform is zero, the alternator status is malfunction.

10. A system as claimed in claim 4, a determination of remaining electrical energy operating time of the battery is made from a consideration of the battery terminal voltage, voltage gradient, the gradient change, and a predetermined end of discharge voltage;
    the determination being taken on a regular periodic basis.

11. A system as claimed in claim 6 wherein:
    if the engine speed is above the pre-set minimum, a ripple factor is below a predetermined maximum, and the battery terminal voltage within an acceptable range, the internal combustion engine status is normal; and
    a status of the battery being determined from a consideration of engine speed being above the pre-set minimum, the ripple factor being lower than the predetermined maximum, and the battery terminal voltage being within the acceptable range.

12. A system as claimed in claim 6, wherein:
the status of the alternator is determined from a consideration of an ignition pulse frequency, the ripple waveform, the battery terminal voltage, and the speed of the internal combustion engine; and
a battery charge status is determined from a consideration of the ripple factor and the battery terminal voltage; upon the battery being degraded, the ripple factor is greater than the predetermined maximum and the battery terminal voltage is within the required voltage range; and the ripple factor is used to determine a battery impedance status.

13. A system as claimed in claim 4, wherein a ratio of a speed of the alternator to the speed of the internal combustion engine is used to determine the status of an alternator drive belt; the ratio is compared to a highest recorded ratio; and the comparison is below a minimum figure, the alternator is faulty as one phase is not working.

14. A system as claimed in claim 9, wherein the alternator is undersized if the battery terminal voltage is below a predetermined minimum voltage, the engine speed is above the pre-set minimum, the ripple factor is below the predetermined maximum, and the alternator rotation is within an acceptable range.

15. A system as claimed in claim 9, wherein the alternator is faulty if the battery terminal voltage is above a predetermined maximum voltage, the engine speed is above the pre-set minimum, the ripple factor is below the predetermined maximum, and the alternator rotation is within an acceptable range.

16. A system as claimed in claim 9, wherein the battery is undersized if the discharge voltage gradient is below a predetermined level, the battery terminal voltage is between a predetermined maximum voltage and a predetermined minimum voltage, the engine speed is above the pre-set minimum, the ripple factor is below the predetermined maximum, and the alternator rotation is within an acceptable range.

17. A system as claimed in claim 4, wherein:
to determine a cranking circuit quality before an armature rotates, the ratio of the highest recorded beginning cranking voltage gradient to the beginning cranking voltage gradient is recorded as a percentage to show the cranking circuit quality;
the condition of the cranking circuit quality is determined by at least one selected from the group consisting of: the starter condition, the condition of the starter brushes, battery terminal connection, battery cable connection, battery condition, battery electrolyte condition, and battery impedance; and
the cranking circuit quality is unacceptable when the cranking circuit quality is less than the predetermined minimum required cranking circuit quality.

18. A system as claimed in claim 4, wherein:
a static cranking torque capability of the internal combustion engine is determined by use of: a cranking voltage ratio of the lowest valley voltage to a voltage at maximum power transfer before an armature rotates, converting the voltage ratio to a current ratio, and recording the current ratio as a percentage for the static cranking torque capability of the internal combustion engine;
a determination of the static cranking torque capability is made by at least one of the group consisting of: if the battery is undersized when the cranking circuit quality is acceptable and the static cranking torque capability is below an acceptable limit, if the starter is unacceptable when the static cranking torque capability is below the acceptable limit, if the battery condition is unacceptable when the static cranking torque capability is below the acceptable limit, if the battery terminal is poorly contacted when the static cranking torque capability is below the acceptable limit, and if the battery cable is poorly contacted when the static cranking torque capability is below the acceptable limit; and
upon the cranking torque capability becoming unacceptable the cranking torque capability is less than the predetermined minimum required cranking torque capability.

19. A system as claimed in claim 4, wherein a cranking power capability is determinable by converting a cranking voltage from when an armature commences rotating to an end of cranking to a voltage equivalent of the armature back emf; determining an emf ratio of armature back emf and a maximum power transfer armature back emf converting the emf ratio to a corresponding power ratio; record the corresponding power ration as a percentage to show the cranking power capability.

20. A system as claimed in claim 4, wherein a cranking power capability is determined by computing the ratio of the cranking battery terminal voltage from when the starter armature commences rotating, to an end of cranking, to a maximum cranking power battery terminal voltage; converting the ratio to a corresponding power ratio, and expressing the corresponding power ratio as a percentage to show the cranking power capability.

21. A system as claimed in claim 19, wherein the cranking power capability is used to determine the presence of at least one of:
(a) starter is malfunctioning when the cranking circuit quality and cranking torque capability are within their respective pre-set limits,
(b) the battery is undersized when the cranking circuit quality is within limits,
(c) the battery terminal is poorly contacted,
(d) the battery cable poorly is contacted, and
(e) the battery condition is unacceptable when the cranking power capability is below a predetermined minimum required cranking power capability.

22. A system as claimed in claim 19, wherein the cranking power capability is unacceptable when the cranking power capability is less than the predetermined minimum required cranking power capability.

23. A system as claimed in claim 4, wherein:
the output is at least one full color LED the color of which is modulated by a plurality of primary colors in an illumination duty cycle according to a voltage ratio of battery terminal voltage under load to no-load, the color of the LED corresponding the voltage of the battery;
the LED color is dependent upon the battery terminal voltage; and
upon the battery charge status; and the LED acts as a color-voltmeter.

24. A system as claimed in claim 23, wherein:
the at least one LED is used to provide the output for one or more selected from the group consisting of: cranking power capability, cranking torque capability, status of the battery, alternator status, and cranking circuit quality; and
upon it being determined that the alternator and battery are in good condition, the LED is reduced to an intensity as a percentage of full intensity, the percentage being in a range from of 0% to 75%.

25. A system as claimed in claim 4, wherein:
the output is an audio generator;
the audio generator being used to output an audio signal depending on the quality of one or more selected from the group consisting of: the initial condition, low battery charge, battery over charge, low cranking circuit quality, low cranking power capability, low cranking torque capability, at least one battery cell damaged, and alternator malfunction; and the audio signal is varied according to one or more selected from the group consisting of: frequency, number of tones, duty cycle, base frequency, and string.

26. A computer usable medium comprising a computer program code that is configured to cause at least one processor to execute one or more functions to perform the steps of claim 4.

* * * * *